(12) United States Patent
Nakayama et al.

(10) Patent No.: US 11,354,569 B2
(45) Date of Patent: Jun. 7, 2022

(54) NEURAL NETWORK COMPUTATION CIRCUIT INCLUDING SEMICONDUCTOR STORAGE ELEMENTS

(71) Applicant: PANASONIC CORPORATION, Osaka (JP)

(72) Inventors: Masayoshi Nakayama, Kyoto (JP); Kazuyuki Kouno, Osaka (JP); Yuriko Hayata, Osaka (JP); Takashi Ono, Osaka (JP); Reiji Mochida, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 332 days.

(21) Appl. No.: 16/806,928

(22) Filed: Mar. 2, 2020

(65) Prior Publication Data

US 2020/0202203 A1   Jun. 25, 2020

Related U.S. Application Data

(63) Continuation of application No. PCT/JP2018/030862, filed on Aug. 21, 2018.

(30) Foreign Application Priority Data

Sep. 7, 2017   (JP) .............. JP2017-172094

(51) Int. Cl.
*G06N 3/063* (2006.01)
*G11C 11/54* (2006.01)
*G11C 13/00* (2006.01)

(52) U.S. Cl.
CPC .............. *G06N 3/063* (2013.01); *G11C 11/54* (2013.01); *G11C 13/003* (2013.01); *G11C 13/0026* (2013.01); *G11C 13/0028* (2013.01)

(58) Field of Classification Search
CPC ..................................................... G06N 3/063
(Continued)

(56) References Cited

U.S. PATENT DOCUMENTS 5,448,682 A * 9/1995 Chung .................. G06N 3/063
706/41
5,909,407 A   6/1999 Yamamoto et al.
(Continued)

FOREIGN PATENT DOCUMENTS

JP   H11-66850   3/1999
JP   H11-203894   7/1999

OTHER PUBLICATIONS

M. Prezioso et al.,"Training and operation of an integrated neuromorphic network based on metal-oxide memristors," nature,vol. 521,2015,pp. 61-64.*

(Continued)

*Primary Examiner* — Muna A Techane
(74) *Attorney, Agent, or Firm* — McDermott Will & Emery LLP

(57) ABSTRACT

A neural network computation circuit includes in-area multiple-word line selection circuits that are provided in one-to-one correspondence to a plurality of word line areas into which a plurality of word lines included in a memory array are logically divided. Each of the in-area multiple-word line selection circuits sets one or more word lines in a selected state or a non-selected state, and includes a first latch and a second latch provided for each word line.

10 Claims, 13 Drawing Sheets

(58) Field of Classification Search
USPC .......................................................... 706/33
See application file for complete search history.

(56) References Cited

U.S. PATENT DOCUMENTS

| | | | |
|---|---|---|---|
| 5,995,429 A | 11/1999 | Kojima et al. | |
| 8,676,734 B2* | 3/2014 | Aparin | G06N 3/063 706/43 |
| 10,248,675 B2* | 4/2019 | Birdwell | G06N 3/0635 |

OTHER PUBLICATIONS

Fang Su, et al., "A462GOPs/J RRAM-Based Nonvolatile Intelligent Processor fo rEnergy Harvesting IoE System featuring Nonvolatile Logics and Processing-In-Memory," 2017 Symposium on VLSI Circuits Diges of Technical papers, 2017, pp. C260-C261.*

International Search Report issued in corresponding International (PCT) Application No. PCT/JP2018/030862, dated Nov. 27, 2018, with English translation.

Fang Su, et al., "A 462GOPs/J RRAM-Based Nonvolatile Intelligent Processor for Energy Harvesting IoE System Featuring Nonvolatile Logics and Processing-In-Memory," 2017 Symposium on VLSI Circuits Digest of Technical Papers, 2017, pp. C260-C261.

* cited by examiner

FIG. 13

| $a_8$ | $a_7$ | $a_6$ | $a_5$ | $a_4$ | $a_3$ | $a_2$ | $a_1$ |
|---|---|---|---|---|---|---|---|
| 1 | 0 | 0 | 1 | 1 | 1 | 0 | 1 |

| $b_8$ | $b_7$ | $b_6$ | $b_5$ | $b_4$ | $b_3$ | $b_2$ | $b_1$ |
|---|---|---|---|---|---|---|---|
| 1 | 1 | 0 | 1 | 0 | 1 | 1 | 0 |

| $z_2$ | $z_1$ |
|---|---|
| 0 | 1 |

| $a_7$ | $a_6$ | $a_5$ | $a_4$ | $a_3$ | $a_2$ | $a_1$ |
|---|---|---|---|---|---|---|
| 0 | 0 | 1 | 1 | 1 | 0 | 1 |

| $b_7$ | $b_6$ | $b_5$ | $b_4$ | $b_3$ | $b_2$ | $b_1$ |
|---|---|---|---|---|---|---|
| 1 | 0 | 1 | 0 | 1 | 1 | 0 |

| $z_1$ | $z_2$ |
|---|---|
| 0 | 1 |

NEURAL NETWORK COMPUTATION CIRCUIT INCLUDING SEMICONDUCTOR STORAGE ELEMENTS

CROSS REFERENCE TO RELATED APPLICATIONS

This application is a U.S. continuation application of PCT International Patent Application Number PCT/JP2018/030862 filed on Aug. 21, 2018, claiming the benefit of priority of Japanese Patent Application Number 2017-172094 filed on Sep. 7, 2017, the entire contents of which are hereby incorporated by reference.

BACKGROUND

1. Technical Field

The present disclosure relates to a neural network computation circuit including semiconductor storage elements, for example, a word line selection circuit for such a computation circuit, and the like.

2. Description of the Related Art

Along with the development of information and communication technology, attention has been paid to IoT (Internet of Things) technology with which all kinds of things are connected to the Internet. With the IoT technology, various electronic devices are expected to provide higher performance by being connected the Internet. In recent years, as a technology for achieving even higher performance, research and development has actively been carried out on AI (Artificial Intelligence) technology with which electronic devices can learn and make decisions by themselves.

In the AI technology, neural network technology is used that mimics information processing of human brains in an engineering approach, and research and development has actively been carried out on a semiconductor integrated circuit in which neural network computation can be performed at high speed with low power consumption.

A neural network circuit includes a plurality of basic elements called neurons that are connected with junctions called synapses that have connection weighting factors with different inputs, and can perform advanced computation operations including image recognition and voice recognition as a result of the plurality of neurons being connected to each other. The neurons perform multiplication-accumulation computation operations in which inputs are multiplied by the connection weighting factors and then are summed.

"Training and operation of an integrated neuromorphic network based on metal-oxide memristors" by M. Prezioso, et al., Nature, no. 521, pp. 61 to 64, 2015 (NPTL 1) discloses a configuration of a computation circuit for a neural network in which connection weighting factors of the neural network are stored in resistance variable non-volatile memory elements.

In the configuration, the connection weighting factors of the neural network are stored in the resistance variable non-volatile memory element in which analog resistance values can be set, analog voltage values that correspond to input data are applied to the non-volatile memory elements, and analog current values of electric current flowing at this time are used.

The multiplication-accumulation computation operation in each neuron is performed by storing the connection weighting factors in the plurality of non-volatile memory elements as analog resistance values, applying the plurality of analog voltage values that correspond to input data to the plurality of non-volatile memory elements, and adding up the current values of flowing electric current to obtain analog current values as the result of multiplication-accumulation computation.

Because the multiplication-accumulation computation operations of the plurality of neurons can be carried out simultaneously, a high-speed operation with low power consumption can be achieved. However, the inputs and outputs of the neurons are processed using analog voltage values or analog current values, and it is therefore necessary to convert analog values to digital values by using analog-digital converter circuits (AD converter circuits), and also convert digital values to analog values by using digital-analog converter circuits (DA converter circuits) during transmission of information between neurons, which is problematic in that it is difficult to apply the configuration to a semiconductor integrated circuit in a large-scale neural network circuit, or in other words, it is difficult to achieve large-scale semiconductor integration.

"A 462GOPs/J RRAM-Based Nonvolatile Intelligent Processor for Energy Harvesting IoE System Featuring Non-volatile Logics and Processing-In-Memory," by F. Su, et al., Symposium on VLSI Circuits Digest of Technical Papers, C260 to C261, 2017 (NPTL 2) discloses another configuration of a computation circuit for a neural network in which connection weighting factors of the neural network are stored in resistance variable non-volatile memory elements.

As input data of neurons in the neural network, a selected state of word lines of a memory array (positive-side memory array) in which resistance variable non-volatile memory elements that store positive-side connection weighting factors are arranged in an array and a memory array (negative-side memory array) in which non-volatile memory elements that store negative-side connection weighting factors are arranged in an array is used. In the selected state of word lines that correspond to the input data, analog current values obtained by applying voltage to a plurality of non-volatile memory elements and adding up the current values of flowing electric current are converted to voltage values by determination circuits that are connected to bit lines of the positive-side memory array and the negative-side memory array, the result of comparison is obtained as output data of the result of multiplication-accumulation computation of neuron by obtaining digital values.

The input data and the output data are processed using digital values, and the transmission of information between neurons can also be performed using digital values. Accordingly, it is unnecessary to separately provide an analog-digital converter circuit (AD converter circuit) and a digital-analog converter circuit (DA converter circuit), and thus semiconductor integration can be relatively easily achieved as compared with the configuration of NPTL 1 that processes input data and output data in an analog manner.

On the other hand, in the computation operation performed in the neural network, a computation operation is required in which the output results of neurons are used as input data input to the neurons of a connection destination. In order to implement this, a positive-side memory array, a negative-side memory array, and circuitry that convers analog current values to voltage and performs comparison are separately prepared. Also, in order to implement the selected state of word lines that correspond to input data, a word line selection circuit for selecting a plurality of word lines is necessary, which is achieved by providing one flip-flop for each word line.

Japanese Unexamined Patent Application Publication No. H11-203894 (PTL 1) discloses a configuration in which a latch is provided for each word line of a memory array as a configuration that simultaneously selects a plurality of word lines.

SUMMARY

In order to solve the problems described above, a neural network computation circuit including semiconductor storage elements according to one aspect of the present disclosure is a neural network computation circuit including semiconductor storage elements, the neural network computation circuit including: a memory array that includes a plurality of memory cells arranged in rows and columns, each of the plurality of memory cells being connected to one of a plurality of word lines and one of a plurality of bit lines; a multiple-word line selection circuit that sets one or more word lines of the plurality of word lines in a selected state or a non-selected state; n determination circuits that perform computation operations of neurons of a neural network, n being an integer of 1 or more; a column selection circuit that connects one or more of the plurality of bit lines to each of the n determination circuits; and a control circuit that controls the multiple-word line selection circuit, wherein the plurality of word lines are logically divided into a plurality of word line areas, each of the plurality of word line areas including n word lines, the multiple-word line selection circuit includes a plurality of in-area multiple-word line selection circuits that are provided in one-to-one correspondence to the plurality of word line areas, each of the plurality of in-area multiple-word line selection circuits setting the n word lines included in a corresponding one of the plurality of word line areas in a selected state or a non-selected state, each of the plurality of in-area multiple-word line selection circuits includes a first latch and a second latch provided for each of the n word lines, determines a set state of the first latch and a set state of the second latch based on an area selection signal, an in-area word line control signal, a first latch control signal, a second latch control signal, and a word line selection signal that are controlled by the control circuit, and sets a corresponding one of the n word lines in a selected state or a non-selected state based on the set state of the first latch, and in a multiple-word line selected state selected by the multiple-word line selection circuit, the n determination circuits each perform a determining operation of outputting a first logical value or a second logical value as output data of the computation operations of the neurons of the neural network based on a voltage state of the one or more of the plurality of bit lines connected by the column selection circuit or a current state of electric current flowing through the one or more of the plurality of bit lines.

Also, in the neural network computation circuit including semiconductor storage elements according to the aspect of the present disclosure, the control circuit may perform the determining operation a plurality of times in the multiple-word line selected state, the control circuit may sequentially perform an operation of determining, based on n results obtained in a single instance of the determining operation, set states of n second latches provided in one of the plurality of in-area multiple-word line selection circuits selected based on the area selection signal, while switching the area selection signal, the n second latches being the second latch provided for each of the n word lines, and after performing the determining operation the plurality of times, the control circuit may transfer and set the set states of the n second latches to and in first latches connected to the n second latches, the first latches being the first latch provided for each of the n word lines.

Also, in the neural network computation circuit including semiconductor storage elements according to the aspect of the present disclosure, the multiple-word line selected state may correspond to input data of the neurons of the neural network.

Also, in the neural network computation circuit including semiconductor storage elements according to the aspect of the present disclosure, each of the plurality of memory cells may store connection weighting factors of the neural network.

Also, in the neural network computation circuit including semiconductor storage elements according to the aspect of the present disclosure, each of the plurality of memory cells may be a resistance variable non-volatile memory element that is formed using a resistance variable element, and may store connection weighting factors of the neural network as resistance values.

Also, a neural network computation circuit including semiconductor storage elements according to one aspect of the present disclosure is a neural network computation circuit including semiconductor storage elements, the neural network computation circuit including: a memory array that includes a plurality of memory cells arranged in rows and columns, each of the plurality of memory cells being connected to one of a plurality of word lines and one of a plurality of bit lines; a multiple-word line selection circuit that sets one or more word lines of the plurality of word lines in a selected state or a non-selected state; n determination circuits that perform computation operations of neurons of a neural network, n being an integer of 1 or more; one or more readout circuits that determine logic states of the plurality of memory cells; a column selection circuit that connects one or more of the plurality of bit lines to each of the n determination circuits or to the one or more readout circuits; and a control circuit that controls the multiple-word line selection circuit, wherein the plurality of word lines are logically divided into a plurality of word line areas, each of the plurality of word line areas including n word lines, the multiple-word line selection circuit includes a plurality of in-area multiple-word line selection circuits that are provided in one-to-one correspondence to the plurality of word line areas, each of the plurality of in-area multiple-word line selection circuits being capable of performing two operations: an operation in a neural network computation operation mode of setting the n word lines included in a corresponding one of the plurality of word line areas in a selected state or a non-selected state; and an operation in a memory operation mode of setting one word line included in the corresponding one of the plurality of word line areas in a selected state or a non-selected state by switching between the two operations, each of the plurality of in-area multiple-word line selection circuits includes a first latch, a second latch, and a switching circuit that is connected to an output of the first latch provided for each of the n word lines, with an area selection signal, an in-area word line control signal, a first latch control signal, a second latch control signal, a word line selection signal, and a mode switching signal that are controlled by the control circuit, when the mode switching signal is in a signal state that corresponds to the neural network computation operation mode, each of the plurality of in-area multiple-word line selection circuits determines a set state of the first latch and a set state of the second latch and sets the corresponding word line based on the set state of the first latch via the switching circuit in a selected state or a non-selected state, as the neural network computation operation mode, and when the mode switching signal is in a signal state that corresponds to the memory operation mode, each of the plurality of in-area multiple-word line selection circuits sets the corresponding word line based on the area selection signal, the in-area word line control signal, and the word line selection signal via the switching circuit in a selected state or a non-selected state, as the memory operation mode, during the neural network computation operation mode, in a multiple-word line selected state selected by the multiple-word line selection circuit, the n determination circuits each perform a determining operation of outputting a first logical value or a second logical value as output data of the computation operations of the neurons of the neural network based on a voltage state of the one or more of the plurality of bit lines connected by the column selection circuit or a current state of electric current flowing through the one or more of the plurality of bit lines, in the memory operation mode, in a state in which one word line is selected by the multiple-word line selection circuit, the one or more readout circuits performs a readout/determining operation of outputting a first logical value or a second logical value as memory data based on a voltage state of the one or more of the plurality of bit lines connected by the column selection circuit or a current state of electric current flowing through the one or more of the plurality of bit lines.

Also, in the neural network computation circuit including semiconductor storage elements according to the aspect of the present disclosure, the control circuit may perform the determining operation a plurality of times in the multiple-word line selected state, the control circuit may sequentially perform an operation of determining, based on n results obtained in a single instance of the determining operation, set states of n second latches provided in one of the plurality of in-area multiple-word line selection circuits selected based on the area selection signal, while switching the area selection signal, the n second latches being the second latch provided for each of the n word lines, and after performing the determining operation the plurality of times, the control circuit may transfer and set the set states of the n second latches to and in first latches connected to the n second latches, the first latches being the first latch provided for each of the n word lines.

Also, in the neural network computation circuit including semiconductor storage elements according to the aspect of the present disclosure, the multiple-word line selected state during the neural network computation operation mode may correspond to input data of the neurons of the neural network.

Also, in the neural network computation circuit including semiconductor storage elements according to the aspect of the present disclosure, each of the plurality of memory cells may store connection weighting factors of the neural network or memory data.

Also, in the neural network computation circuit including semiconductor storage elements according to the aspect of the present disclosure, each of the plurality of memory cells may be a resistance variable non-volatile memory element that is formed using a resistance variable element, and may store connection weighting factors of the neural network as resistance values or stores memory data.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 13 is a diagram showing an example of input data of input layer 72, results of computation performed by neurons of hidden layer 73, and output data of output layer 74, relating to computation operations performed in the neural network shown in FIG. 12;

DETAILED DESCRIPTION OF THE EMBODIMENTS

Hereinafter, embodiments according to the present disclosure will be described with reference to the drawings.

The basic operations of neural network computation will be described first.

Figure 7:
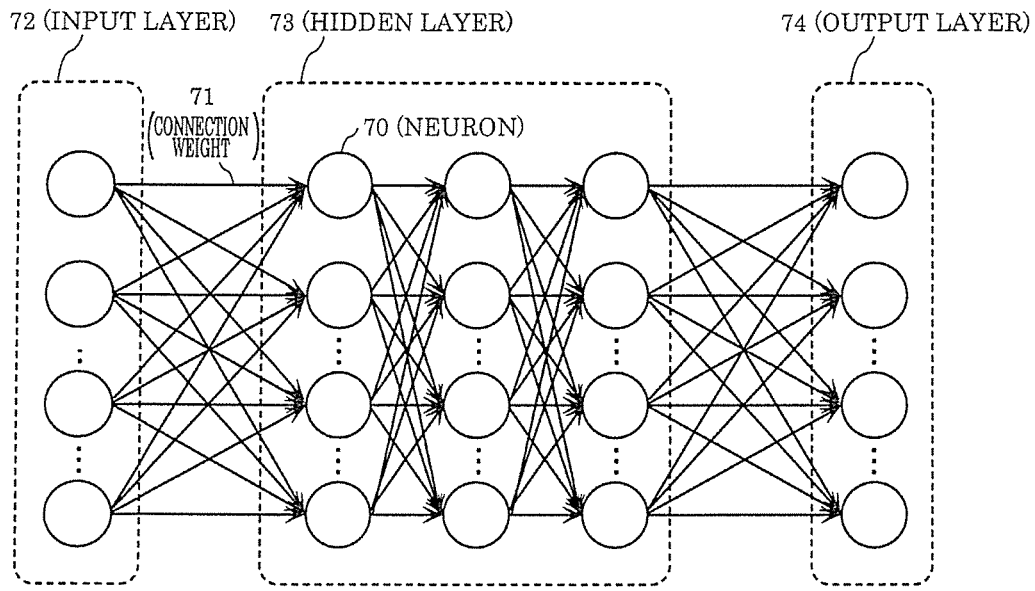
FIG. 7 is a diagram showing a deep neural network.

FIG. 7 is a diagram showing a configuration of a deep neural network. The deep neural network shown in FIG. 7 includes input layer 72 that inputs input data; hidden layer 73 that receives the input data from input layer 72 and performs computation processing; and output layer 74 that receives output data from hidden layer 73 and performs computation processing.

Each of input layer 72, hidden layer 73, and output layer 74 includes a plurality of basic elements called neurons 70 that form the neural network, and neurons 70 are connected via connection weights 71.

The plurality of connection weights 71 have different connection weighting factors, and connect neurons 70.

A plurality of input data items are input to each neuron 70, and neuron 70 performs a multiplication-accumulation computation operation using connection weighting factors that correspond to the plurality of input data items, and outputs the results as output data.

Here, hidden layer 73 has a configuration in which neurons in a plurality of columns (thee columns in FIG. 7) are connected, thereby forming a deeply structured neural network. Accordingly, this configuration is called a deep neural network.

Figure 8:
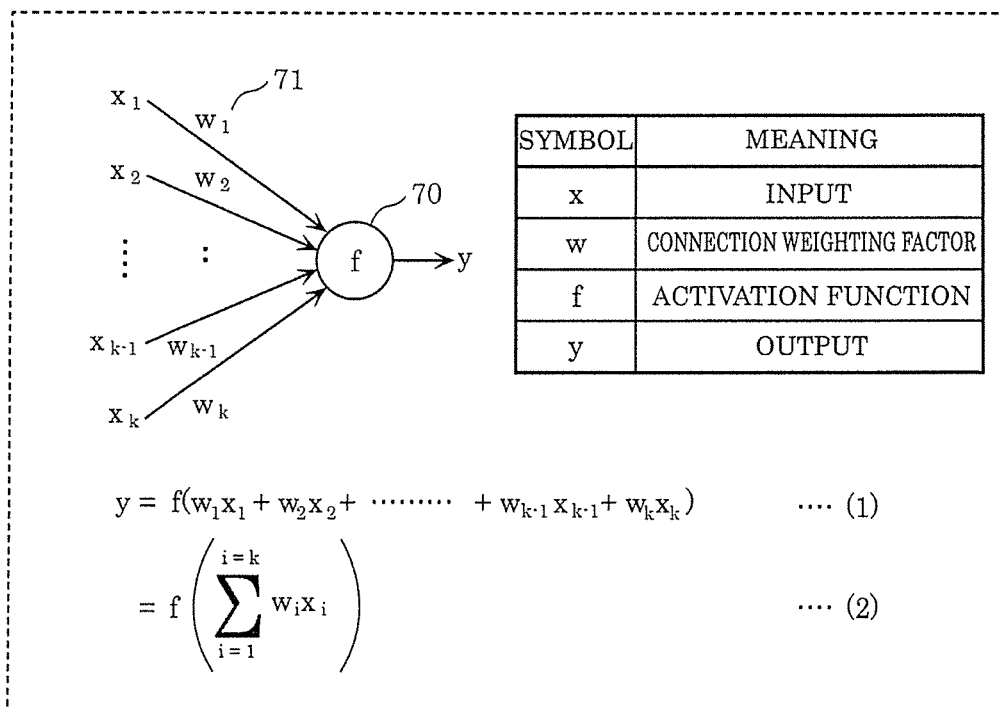
FIG. 8 is a diagram showing calculation performed by a neuron in neural network computation.

FIG. 8 is a diagram showing calculation performed by neuron 70 in the neural network computation. Equations (1) and (2) are calculating formulae used by neuron 70 to perform calculation.

Neuron 70 is connected to k connection weights having inputs $x_1$ to $x_k$ by connection weighting factors $w_1$ to $w_k$, and multiplication-accumulation computation is performed using inputs $x_1$ to $x_k$.

Neuron 70 has activation function f. Neuron 70 performs computation processing using the activation function on the results of multiplication-accumulation computation using inputs $x_1$ to $x_k$ and connection weighting factors $w_1$ to $w_k$, and outputs output y.

Here, the description will be given assuming that activation function f of neuron 70 in the neural network computation according to the embodiment of the present disclosure is a step function that has a value of "1" when the result of multiplication-accumulation computation is a fixed value or more, and has a value of "0" when the result of multiplication-accumulation computation is less than the fixed value, and the input data and the output data of each neuron 70 take either of two values of "0" and "1".

Embodiment 1

Figure 1:
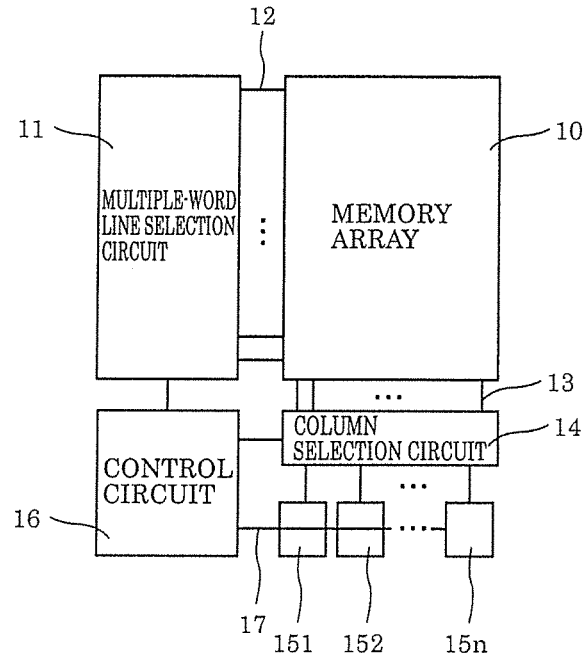
FIG. 1 is a diagram showing a configuration of a neural network computation circuit including semiconductor storage elements according to Embodiment 1.

FIG. 1 is a diagram showing a configuration of a neural network computation circuit including semiconductor storage elements according to Embodiment 1. The computation circuit shown in FIG. 1 includes memory array 10, multiple-word line selection circuit 11, n determination circuits 151 to 15n (where n is an integer of 1 or more), column selection circuit 14, and control circuit 16.

Memory array 10 includes a plurality of memory cells that are arranged in rows and columns. Each of the plurality of memory cells is connected to one of a plurality of word lines 12 and one of a plurality of bit lines 13. Word line multiple selection circuit 11 sets one or more word lines of the plurality of word lines 12 in a selected state or a non-selected state. Column selection circuit 14 connects one or more of the plurality of bit lines 13 to each of n determination circuits 151 to 15n. Control circuit 16 controls multiple-word line selection circuit 11, column selection circuit 14, and determination circuits 151 to 15n. Word line multiple selection circuit 11 is used as a word line selection circuit for implementing the neural network computation circuit shown in FIG. 7.

Determination circuits 151 to 15n are circuits that each perform a determining operation in which a multiple-word line selected state in which multiple word lines are selected by multiple-word line selection circuit 11 is used as input data input to neuron 70, and a first logical value ("0") or a second logical value ("1") is used as output data as a result of multiplication-accumulation computation operation of neuron 70 based on the voltage state of bit lines 13 connected by column selection circuit 14 or the electric current state of electric current flowing through bit lines 13, and n output data items (determination results) 17 are simultaneously output from n determination circuits.

The plurality of word lines 12 are logically divided into a plurality of groups (word line areas), each group including n word lines. Here, it is assumed that the plurality of word lines 12 are divided into m word line areas (where m is an integer of 1 or more).

Figure 2:
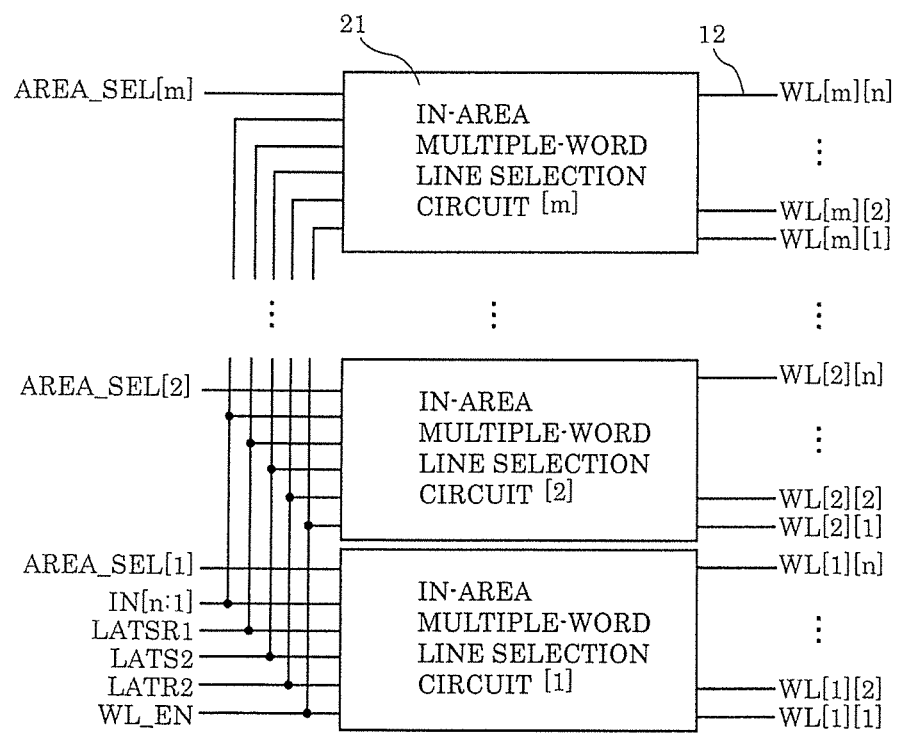
FIG. 2 is a diagram showing a configuration of multiple-word line selection circuit 11 shown in FIG. 1.

FIG. 2 is a diagram showing a configuration of multiple-word line selection circuit 11 shown in FIG. 1. The plurality of word lines 12 (WL [1] [n:1] to WL [m] [n:1]) are divided into m word line areas. Word line multiple selection circuit 11 includes m in-area multiple-word line selection circuits 21 that respectively correspond to m word line areas. For example, WL [m] [n:1] indicates the first to n-th word lines of the word lines included in the m-th word line area.

Figure 3:
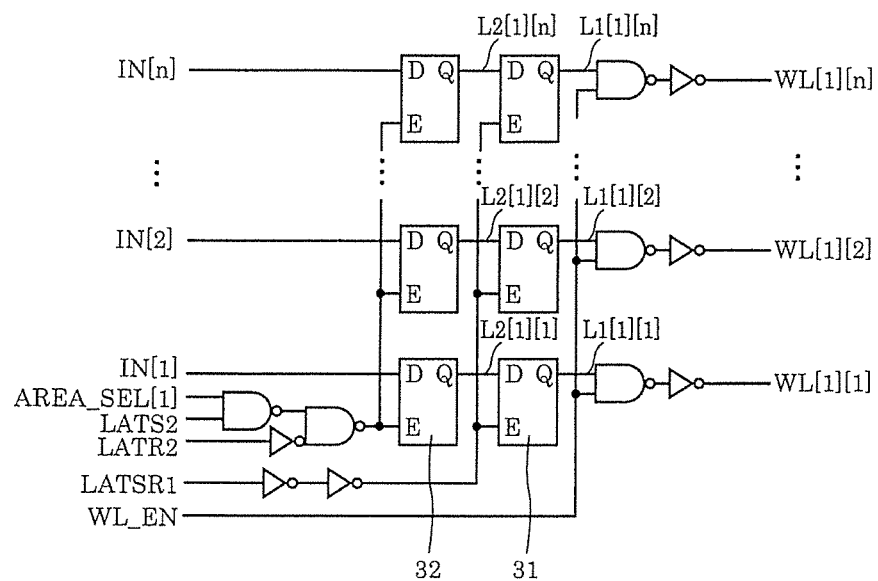
FIG. 3 is a diagram showing a configuration of in-area multiple-word line selection circuit 21 shown in FIG. 2.

FIG. 3 is a diagram showing a configuration of in-area multiple-word line selection circuit 21 shown in FIG. 2, and shows a configuration of in-area multiple-word line selection circuit [1] that corresponds to WL [1] [n:1] from among m in-area multiple-word line selection circuits 21. First latch 31 and second latch 32 are provided for each of the word lines in the word line area.

First latch control signal LATSR1 is connected to input E of first latch 31 via two NOT circuits, and node L2 [1] [n:1] that is output Q of second latch 32 is connected to input D of each of n first latches 31.

Three control signals, namely, word line area selection signal AREA_SEL [1] and second latch control signals LATS2 and LATR2, are connected to input E of second latch 32 via two NAND circuits and one NOT circuit, and in-area word line control signal IN [n:1] is connected to input D of each of n second latches.

The above-described control signals, namely, first latch control signal LATSR1, word line area selection signal AREA_SEL [1], second latch control signals LATS2 and LATR2, and in-area word line control signal IN [n:1] are controlled by control circuit 16.

Figure 4:
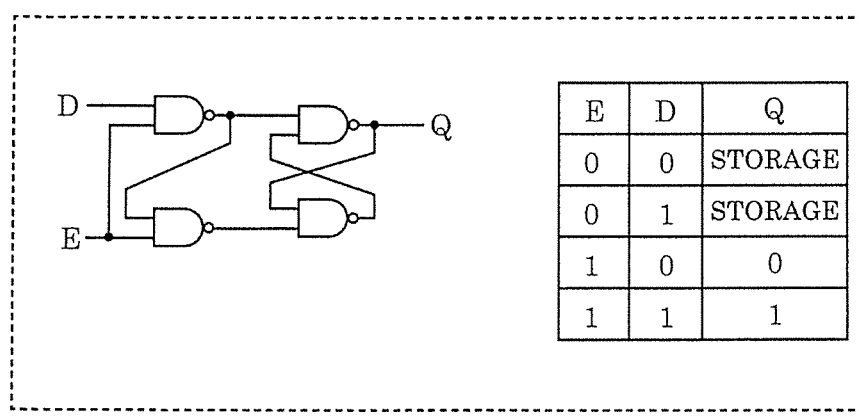
FIG. 4 is a diagram showing a configuration of each of first latch 31 and second latch 32 shown in FIG. 3.

FIG. 4 is a diagram showing a configuration of each of first latch 31 and second latch 32 shown in FIG. 3. First latch 31 and second latch 32 are data latches, and determine and store the set state of output Q based on the logic states of inputs D and E.

Figure 5:
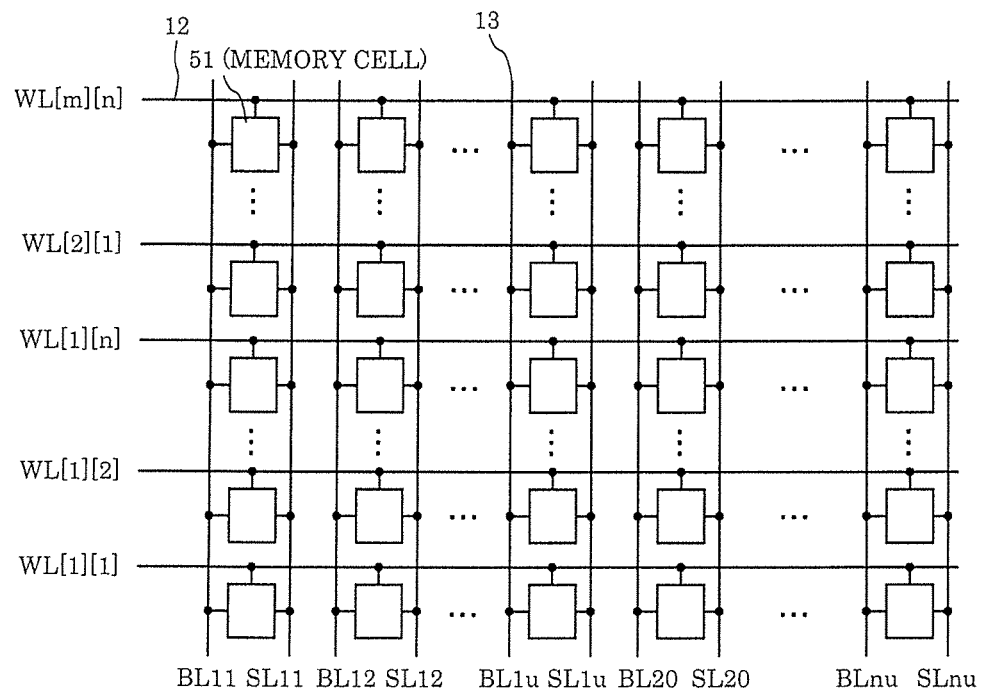
FIG. 5 is a diagram showing a configuration of memory array 10 shown in FIG. 1.

FIG. 5 is a diagram showing a configuration of memory array 10 shown in FIG. 1. In memory array 10, memory cells 51 that are semiconductor storage elements are arranged in rows and columns. Each memory cell is connected to one of the plurality of word lines 12 and one of the plurality of bit lines 13.

The plurality of word lines 12 are indicated by WL [m:1] [n:1], and are logically divided into m groups, each group including n word lines.

The plurality of bit lines 13 are logically divided into n groups, each group including u bit lines (where u is an integer of 1 or more). One or more of the bit lines are connected to n determination circuits 151 to 15n by column selection circuit 14.

For example, one or more of u bit lines BL11 to BL1u are connected to one determination circuit 151, and one or more of u bit lines BL21 to BL2u are connected to determination circuit 152 (where u is an integer). In the same manner as above, one or more of u bit lines BLn1 to BLnu are connected to determination circuit 15n.

The plurality of memory cells 51 are arranged in rows and columns, and are connected to word lines WL [m:1] [n:1] that are the plurality of word lines 12, bit lines BL11 to BLnu that are the plurality of bit lines 13, and a plurality of source lines SL11 to SLnu that are provided correspondingly to the plurality of bit lines 13.

Figure 6:
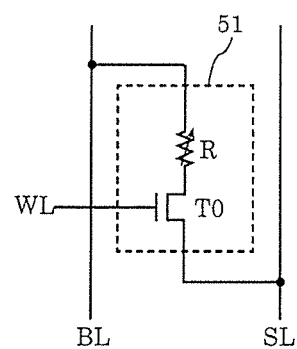
FIG. 6 is a diagram showing a configuration of memory cell 51 shown in FIG. 5.

FIG. 6 is a diagram showing a configuration of memory cell 51 shown in FIG. 5. Memory cell 51 is a resistance variable non-volatile memory element (ReRAM) in which transistor T0 whose gate is connected to a word line and resistance variable element R are connected in series. Bit line BL is connected to one end of resistance variable element R, and source line SL is connected to one end of transistor T0.

In resistance variable element R, connection weighting factors for connecting neurons in the neural network are stored as resistance values, and the resistance values are set and stored by a write circuit, which is not shown in FIG. 1.

The configuration of the neural network computation circuit including semiconductor storage elements according to an aspect of the present disclosure has been described above.

Hereinafter, specific embodiments and operations will be described in detail.

Figure 9:
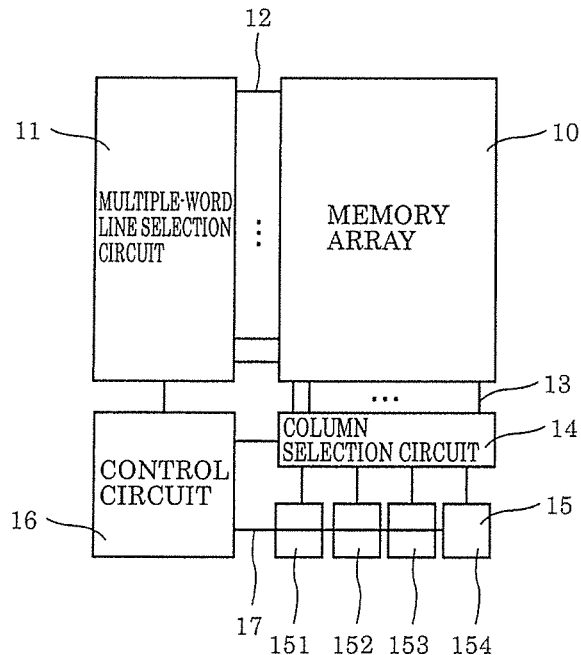
FIG. 9 is a diagram showing an example of the neural network computation circuit including semiconductor storage elements according to Embodiment 1.

FIG. 9 is a diagram showing an example of a configuration of the neural network computation circuit including semiconductor storage elements according to Embodiment 1. The neural network computation circuit shown in FIG. 9 is obtained by modifying the neural network computation circuit including semiconductor storage elements shown in FIG. 1 such that four determination circuits are provided as determination circuits 151 to 154, or in other words, the configuration corresponds to the case where n is set to 4.

Also, the plurality of word lines 12 are divided into four word line areas, or in other words, the configuration corresponds to the case where m is set to 4.

Figure 10:
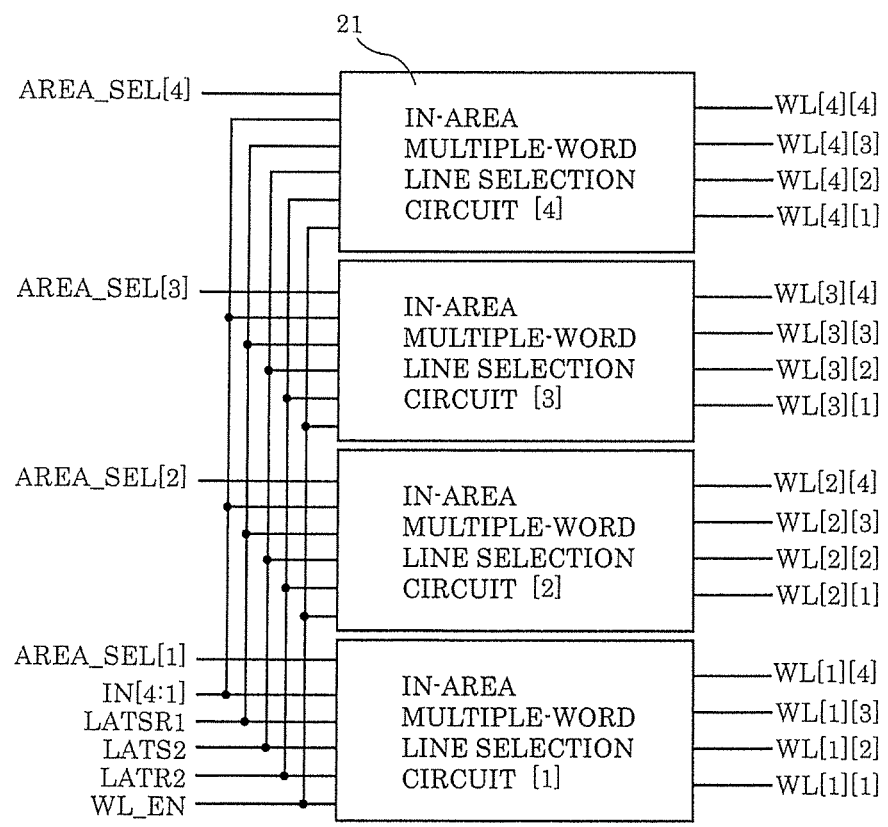
FIG. 10 is a diagram showing a configuration of multiple-word line selection circuit 11 shown in FIG. 9.

FIG. 10 is a diagram showing a configuration of multiple-word line selection circuit 11 shown in FIG. 9. The configuration of multiple-word line selection circuit 11 shown in FIG. 10 is obtained by modifying the configuration of multiple-word line selection circuit 11 shown in FIG. 2 such that four in-area multiple-word line selection circuits 21 are provided so as to correspond to the configuration shown in FIG. 9 in which n is set to 4 and m is set to 4.

Figure 11:
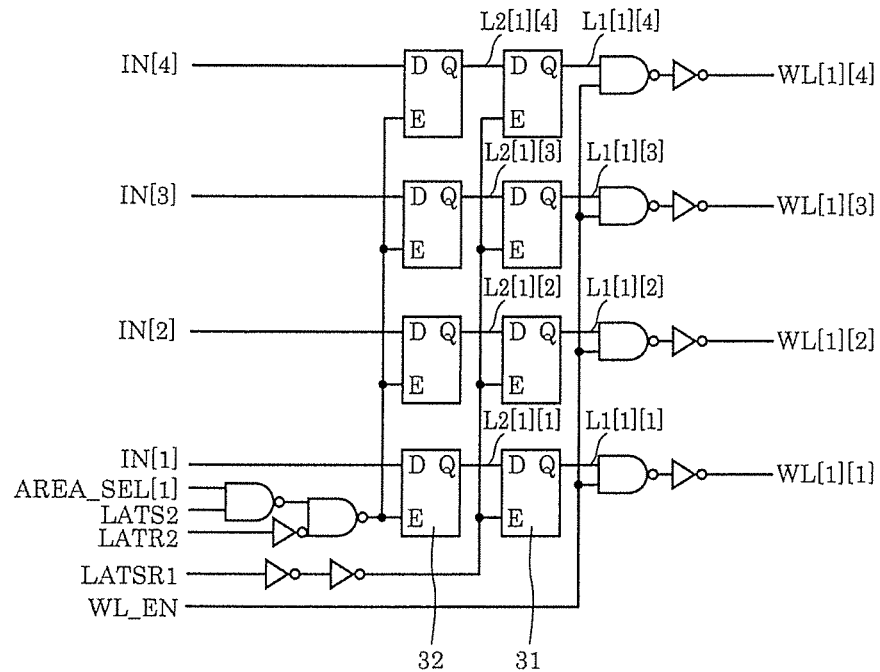
FIG. 11 is a diagram showing a configuration of in-area multiple-word line selection circuit 21 shown in FIG. 10.

FIG. 11 is a diagram showing a configuration of one of four in-area multiple-word line selection circuits 21 shown in FIG. 10 that corresponds to word lines WL [1] [4:1]. In-area multiple-word line selection circuit 21 shown in FIG. 11 is a configuration obtained by modifying the in-area multiple-word line selection circuit shown in FIG. 3 such that n is set to 4.

First latches 31 and second latches 32 are data latches as shown in FIG. 4, as with first latches 31 and second latches 32 shown in FIG. 3.

Figure 12:
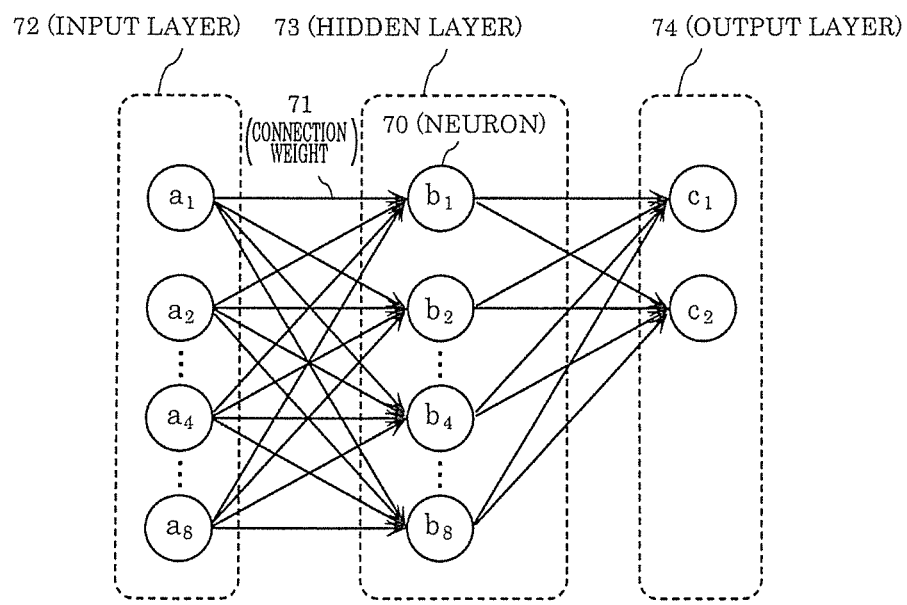
FIG. 12 is a diagram showing an example of a neural network in which computation operations are performed by using the neural network computation circuit including semiconductor storage elements according to Embodiment 1.

FIG. 12 is a diagram showing an example of a neural network in which computation operations are performed by using the neural network computation circuit including semiconductor storage elements according to Embodiment 1. The neural network shown in FIG. 12 is obtained by modifying the deep neural network shown in FIG. 7 such that input layer 72 includes eight inputs, hidden layer 73 includes eight neurons that are arranged in one column, and output layer 74 includes two neurons.

$a_1$ to $a_8$ in input layer 72 indicate input data items of the neural network, and $b_1$ to $b_8$ in hidden layer 73 indicate outputs of eight neurons 70 included in hidden layer 73. The outputs are the results of multiplication-accumulation computation using $a_1$ to $a_8$, which are used as inputs of the neurons, and connection weighting factors of connection weights 71 corresponding thereto.

$c_1$ and $c_2$ in output layer 74 indicate outputs of two neurons 70 included in output layer 74. The outputs are the results of multiplication-accumulation computation using $b_1$ to $b_8$, which are used as inputs of the neurons, and connection weighting factors of connection weights 71 corresponding thereto.

In the present embodiment, the input data and the output data of each neuron 70 take either of two values of "0" and "1".

FIG. 13 shows an example of input data items $a_1$ to $a_8$ of input layer 72, $b_1$ to $b_8$ that are results of computation of neurons of hidden layer 73, and output data items $c_1$ and $c_2$ of output layer 74, relating to computation operations performed in the neural network shown in FIG. 12.

Also, in memory array 10 shown in FIG. 5, four word lines WL [1] [1] to WL [1] [4] in a selected state respectively correspond to input data items $a_1$ to $a_4$, and four word lines WL [2] [1] to WL [2] [4] in a selected state respectively correspond to input data items $a_5$ to $a_8$. In memory cells 51 that are connected to the intersections between eight word lines WL [2:1] [4:1] and one or more bit lines connected to determination circuits 151 to 154 by column selection circuit 14, weighting factors of connection weights 71 that connect input data items $a_1$ to $a_8$ and eight neurons 70 of hidden layer 73 are stored.

Here, the connection weighting factors are stored in a dispersed manner as described below. In memory cells 51 that are connected to the intersections between the word lines and one or more bit lines that are connected to determination circuit 151, connection weighting factors for connecting data items $a_1$ to $a_8$ and $b_1$ and connection weighting factors for connecting data items $a_1$ to $a_8$ and $b_5$ are stored. Likewise, in memory cells 51 that are connected to the intersections between the word lines and one or more bit lines that are connected to determination circuit 152, connection weighting factors for connecting data items $a_1$ to $a_8$ and $b_2$ and connection weighting factors for connecting data items $a_1$ to $a_8$ and $b_6$ are stored. In memory cells 51 that are connected to the intersections between the word lines and one or more bit lines that are connected to determination circuit 153, connection weighting factors for connecting data items $a_1$ to $a_8$ and $b_3$, and connection weighting factors for connecting data items $a_1$ to $a_8$ and $b_7$ are stored. In memory cells 51 that are connected to the intersections between the word lines and one or more bit lines that are connected to determination circuit 154, connection weighting factors for connecting data items $a_1$ to $a_8$ and $b_4$, and connection weighting factors for connecting $a_1$ to $a_8$ and $b_8$ are stored.

Four word lines WL [3] [1] to WL [3] [4] in a selected state correspond to $b_1$ to $b_4$ of $b_1$ to $b_8$ that are output data items of eight neurons included in hidden layer 73, or in other words, input data items of two neurons included in output layer 74. Four word lines WL [4] [1] to WL [4] [4] in a selected state correspond to $b_5$ to $b_8$. In memory cells 51 that are connected to the intersections of eight word lines WL [4:3] [4:1] and one or more bit lines connected to determination circuits 151 to 152 by column selection circuit 14, weighting factors of connection weights 71 that connect eight neurons 70 of hidden layer 73 and two neurons 70 of output layer 74 are stored.

Here, in memory cells 51 that are connected to the intersections between the word lines and one or more bit lines that are connected to determination circuit 151, connection weighting factors for connecting data items $b_1$ to $b_8$ and $c_1$ are stored. In memory cells 51 that are connected to the intersections between the word lines and one or more bit lines that are connected to determination circuit 152, connection weighting factors for connecting data items $b_1$ to $b_8$ and $c_2$ are stored.

In memory cells 51 that are connected to the intersections between the word lines and one or more bit lines that are connected to each of determination circuit 153 and determination circuit 154 at this time, connection weighting factors are not stored.

Figure 14:
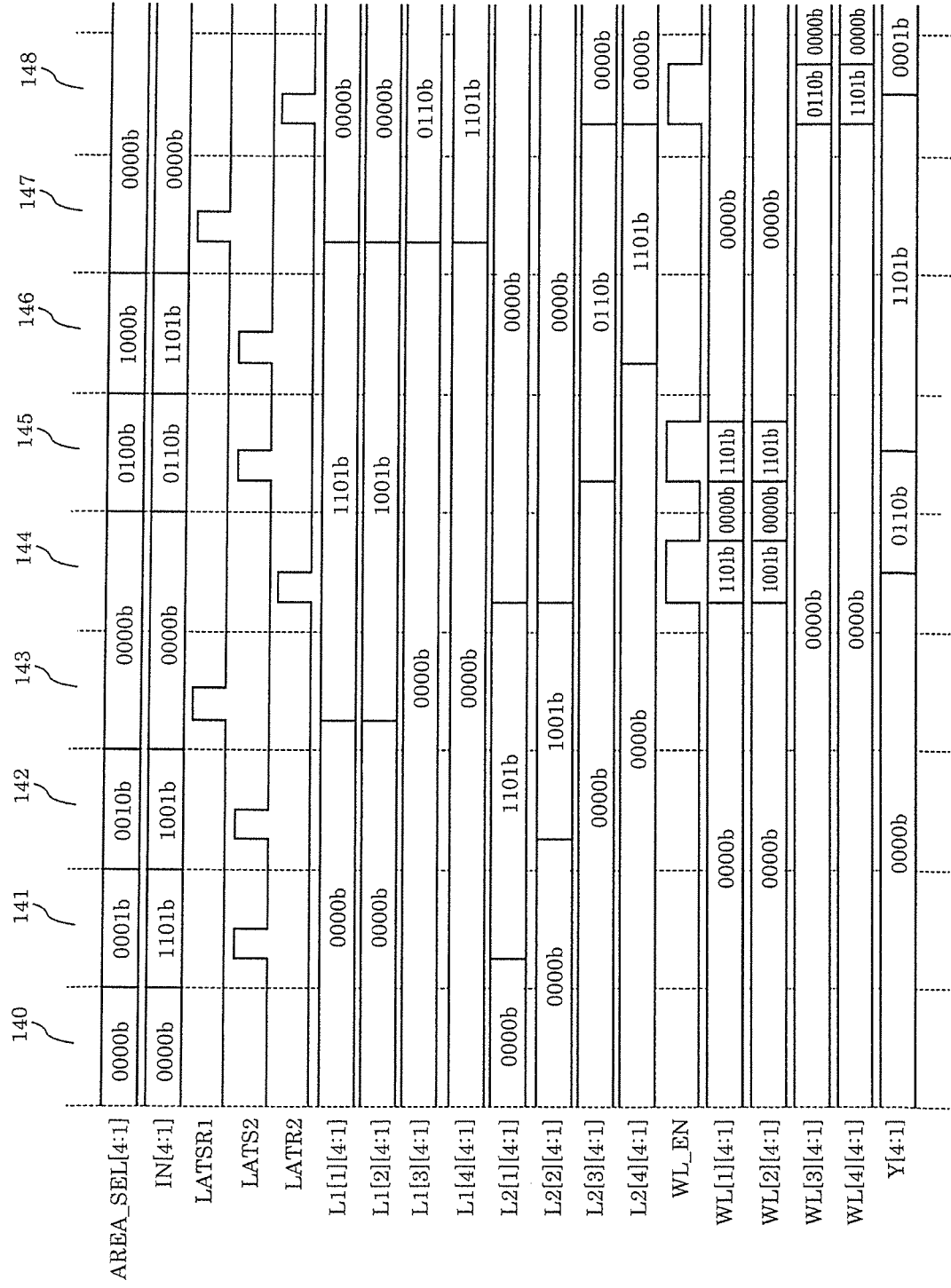
FIG. 14 is a diagram showing computation operations of the neural network computation circuit including semiconductor storage elements according to Embodiment 1 of the present disclosure, which is used as the neural network shown in FIG. 12.

FIG. 14 is a diagram showing operations of the neural network computation circuit according to the present embodiment used as the neural network shown in FIG. 12. FIG. 14 corresponds to the data shown in FIG. 13.

The controls signals of multiple-word line selection circuit 11 shown in FIG. 10, namely, word line area selection signal AREA_SEL [4:1], in-area word line control signal IN [4:1], first latch control signal LATSR1, second latch control signals LATS2 and LATR2, word line selection signal WL_EN, word lines WL [4:1] [4:1], and operational waveforms of output signal L1 [4:1] [4:1] of the first latches shown in FIG. 11 and output signal L2 [4:1] [4:1] of the second latches shown in FIG. 11, and output signal Y [4:1] of determination circuits 151 to 154 are shown.

The signals described in a bus such as AREA_SEL [4:1] indicate a selected state based on the binary logic. When the corresponding signal indicates "H", "1" is written, and when the corresponding signal indicates "L", "0" is written.

The computation operations of the neural network shown in FIG. 12 are performed using nine operation steps 140 to 148.

Operation step 140 is the initial state. In operation steps 141 to 146, the computation operations of eight neurons 70 included in hidden layer 73 are performed. In operation steps 147 and 148, the computation operations of two neurons 70 included in output layer 74 are performed.

Hereinafter, each of the operation steps will be described.

In operation step 141, AREA_SEL [4:1] is set to "0001b", IN [4:1] is set to "1101b" that is data that corresponds to $a_1$ to $a_4$ among eight input data items $a_1$ to $a_8$, and LATS2 is transitioned from "L" level to "H" level and from "H" level to "L" level. As a result, L2 [1] [4:1] that is the output signal of second latches 32 included in in-area multiple-word line selection circuit [1] that is one of in-area multiple-word line selection circuits 21 that corresponds to WL [1] [4:1] is set to "1101b".

Next, in operation step 142, AREA_SEL [4:1] is set to "0010b", IN [4:1] is set to "1001b" that is data that corresponds to $a_8$ to $a_8$ among eight input data items $a_1$ to $a_8$, and LATS2 is transitioned from "L" level to "H" level and from "H" level to "L" level. As a result, L2 [2] [4:1] that is the output signal of second latches 32 included in in-area multiple-word line selection circuit [2] that is one of in-area multiple-word line selection circuits 21 that corresponds to WL [2] [4:1] is set to "1001b".

After this operation step, signals that correspond to eight input data items $a_1$ to $a_8$ are set in L2 [1] [4:1] and L2 [2] [4:1] as output signals of second latches 32.

Next, in operation step 143, LATSR1 is transitioned from "L" level to "H" level and from "H" level to "L" level. As a result, output signals L2 [4:1] [4:1] of the second latches in in-area multiple-word line selection circuit 21 are transferred to and set in output signals L1 [4:1] [4:1] of the respectively connected first latches, and L1 [1] [4:1] is set to "1101b", and L1 [2] [4:1] is set to "1001b".

Next, in operation step 144, WL_EN is transitioned from "L" level to "H" level. As a result, word lines that correspond to input data items $a_1$ to $a_4$ and $a_5$ to $a_8$ are selected for word lines WL [1] [4:1] and WL [2] [4:1], respectively.

In the multiple-word line selected state, column selection circuit 14 connects one or more of the plurality of bit lines of memory array 10 connected to memory cells 51, in which connection weighting factors of connection weights 71 between neurons 70 of input layer 72 and neurons 70 of hidden layer 73 having output data items $b_1$ to $b_4$ are stored, to determination circuits 151 to 154.

Determination circuits 151 to 154 each output one output data item to Y [4:1] as a result of multiplication-accumulation computation operation of neurons, based on the voltage state of the connected bit lines or the electric current state of electric current that flows through the bit lines.

Here, among output data items $b_1$ to $b_8$ of eight neurons 70 of hidden layer 73, Y [4:1] as four output data items that correspond to $b_1$ to $b_4$ is output with "0110b" being set.

At the same time, IN [4:1] is set to "0000b", and LATR2 is transitioned from "L" level to "H" level and from "H" level to "L" level, as a result of which all of output signals L2 [4:1] [4:1] of second latches 32 are set to "0".

Through this operation step, among eight output data items $b_1$ to $b_8$ that are the results of multiplication-accumulation computation operation of eight neurons of hidden layer 73, four output data items $b_1$ to $b_4$ are determined.

On the other hand, in order to perform multiplication-accumulation computation operation of two neurons 70 included in output layer 74, it is necessary to use eight data items $b_1$ to $b_8$ as input data. In operation step 145, which will be described below, four output data items $b_5$ to $b_8$ are determined.

In operation step 145, WL_EN is transitioned from "L" level to "H" level. As a result, word lines that correspond to input data items $a_1$ to $a_4$ and $a_5$ to $a_8$ are selected for word lines WL [1] [4:1] and WL [2] [4:1], respectively.

In the multiple-word line selected state, column selection circuit 14 connects one or more of the plurality of bit lines of memory array 10 connected to memory cells 51, in which connection weighting factors of connection weights 71 between neurons 70 of input layer 72 and neurons 70 of hidden layer 73 having output data items $b_5$ to $b_8$ are stored, to determination circuits 151 to 154.

Determination circuits 151 to 154 each output one output data item to Y [4:1] as a result of multiplication-accumulation computation operation of neurons, based on the voltage state of the connected bit lines or the electric current state of electric current that flows through the bit lines.

Here, among output data items $b_1$ to $b_8$ of eight neurons 70 of hidden layer 73, Y [4:1] as four output data items that correspond to $b_5$ to $b_8$ is output with "1101b" being set.

At this time, AREA_SEL [4:1] is set to "0100b", "0110b", which is output data items $b_1$ to $b_4$ obtained in operation step 144, is set as IN [4:1], and LATS2 is transitioned from "L" level to "H" level and from "H" level to "L" level. As a result, output signal L2 [3] [4:1] of second latch 32 in in-area multiple-word line selection circuit [3] that is one of in-area multiple-word line selection circuits 21 that corresponds to WL [3] [4:1] is set to "0110b".

Next, in operation step 146, AREA_SEL [4:1] is set to "1000b", "1101b", which is output data $b_5$ to $b_8$ obtained in operation step 145, is set as IN [4:1], and LATS2 is transitioned from "L" level to "H" level and from "H" level to "L" level. As a result, output signal L2 [4] [4:1] of second latch 32 in in-area multiple-word line selection circuit [4] that is one of in-area multiple-word line selection circuits 21 that corresponds to WL [4] [4:1] is set to "1101b".

After this operation step, output data items $b_1$ to $b_8$ of hidden layer 73 are determined, and L2 [3] [4:1] and L2 [4] [4:1] are set as the output signals of second latch 32.

Next, in operation step 147, LATSR1 is transitioned from "L" level to "H" level and from "H" level to "L" level. As a result, output signals L2 [4:1] [4:1] of second latches 32 in in-area multiple-word line selection circuit 21 are transferred and set as output signals L1 [4:1] [4:1] of the connected first latches, and L1 [1] [4:1] is set to "0110b" and L1 [2] [4:1] is set to "1101b".

Next, in operation step 148, word line selection signal WL_EN is transitioned from "L" level to "H" level. As a result, word lines that correspond to $b_1$ to $b_4$ and $b_5$ to $b_8$ are selected for word lines WL [3] [4:1] and WL [4] [4:1], respectively.

In the multiple-word line selected state, column selection circuit 14 connects one or more of the plurality of bit lines of memory array 10 connected to memory cells 51, in which connection weighting factors of connection weights 71 between neurons 70 of hidden layer 73 and neurons 70 of output layer 74 are stored, to determination circuits 151 and 152.

Determination circuits 151 and 152 make determination based on the voltage state of the connected bit lines or the electric current state of electric current that flows through the bit lines, and each of determination circuits 151 and 152 outputs one determination result to Y [2:1] as output data of the computation operation of neurons.

No connection weighting factors are stored in memory cells 51 that are connected to the bit lines simultaneously connected to determination circuits 153 and 154, and thus although output data Y [4:3] is invalid output data, here, "00b" is output, and Y [4:1] is output with "0001b" being set.

Output data items $c_1$ and $c_2$ that are valid among four output data items are each Y [2:1], and control circuit 16 performs control to ignore Y [4:3] that is invalid output data.

Through operation steps 140 to 148 described above, the computation operations of the neural network shown in FIG. 12 are possible.

In particular, even when the number of determination circuits that simultaneously perform the multiplication-accumulation computation operation of neurons is less than the number of neurons included in each of input layer 72, hidden layer 73, and output layer 74 of the neural network, the determining operation is performed a plurality of times in the multiple-word line selected state in which multiple word lines are selected based on the set state of first latch 31 provided for each word line, and furthermore, the set state of second latch 32 is determined based on the result of a single instance of the determining operation. By sequentially repeating the above operation, the computation operations of the neural network are implemented.

In the above-described example of the computation operations using the neural network computation circuit including semiconductor storage elements according to Embodiment 1 of the present disclosure, input layer 72 includes eight inputs, hidden layer 73 includes eight neurons, and n that is the number of word lines in a word line area is set to an integral multiple of 4. However, operations are possible even when the number of inputs of input layer 72 and the number of neurons of hidden layer 73 are numbers other than integral multiples of n (here, n is 4). The operations in this case will be described below.

Figures 15, 16:
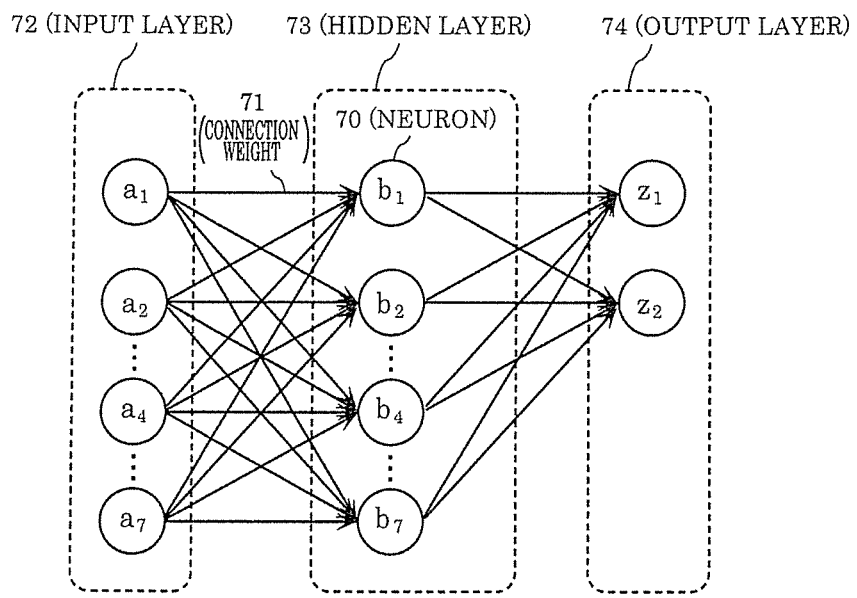
FIG. 15 is a diagram showing an example of the neural network in which computation operations are performed by using the neural network computation circuit including semiconductor storage elements according to Embodiment 1.
FIG. 16 is a diagram showing another example of input data and output data of neurons in the neural network according to Embodiment 1.

FIG. 15 is a diagram showing another example of the neural network in which computation operations are performed by using the neural network computation circuit including semiconductor storage elements according to Embodiment 1. The neural network shown in FIG. 15 is obtained by modifying the deep neural network shown in FIG. 7 such that input layer 72 includes seven inputs, hidden layer 73 includes seven neurons that are arranged in one column, and output layer 74 includes two outputs.

That is, this is an example in which the number of inputs of input layer 72 and the number of neurons of hidden layer 73 are not integral multiples of n (here, n is 4).

Reference numerals $a_1$ to $a_7$ in input layer 72 indicate input data items of the neural network, and reference numerals $b_1$ to $b_7$ in hidden layer 73 indicate outputs of seven neurons 70 included in hidden layer 73, and they are results of multiplication-accumulation computation performed using $a_1$ to $a_7$ as inputs of neurons and connection weighting factors of connection weights 71 that correspond to $a_1$ to $a_7$.

Reference numerals $z_1$ and $z_2$ in output layer 74 indicate outputs of two neurons 70 included in output layer 74, and they are results of multiplication-accumulation computation performed using $b_1$ to $b_7$ as input of neurons and connection weighting factors of connection weights 71 that correspond to $b_1$ to $b_7$.

In the present embodiment, the input data and the output data of neurons 70 take either of two values of "0" and "1".

FIG. 16 shows an example of input data items $a_1$ to $a_7$ of input layer 72, $b_1$ to $b_7$ that are results of computation of neurons of hidden layer 73, and output data items $z_1$ and $z_2$ of output layer 74, relating to computation operations performed in the neural network shown in FIG. 15.

Also, in memory array 10 shown in FIG. 5, four word lines WL [1] [1] to WL [1] [4] in a selected state correspond to input data items $a_1$ to $a_4$ respectively, and three word lines WL [2] [1] to WL [2] [3] in a selected state correspond to input data items $a_5$ to $a_7$, respectively. In memory cells 51 that are connected to the intersections between seven word lines WL [2] [3:1] and WL [1] [4:1] and one or more bit lines connected to determination circuits 151 to 154 by column selection circuit 14, weighting factors of connection weights 71 that connect input data items $a_1$ to $a_7$ and eight neurons 70 of hidden layer 73 are stored.

Here, the connection weighting factors are stored in a dispersed manner as described below. In memory cells 51 that are connected to the intersections between the word lines and one or more bit lines that are connected to determination circuit 151, connection weighting factors for connecting data items $a_1$ to $a_7$ and data item $b_1$, connection weighting factors for connecting data items $a_1$ to $a_7$ and data item $b_5$ are stored. Likewise, in memory cells 51 that are connected to the intersections between the word lines and one or more bit lines that are connected to determination circuit 152, connection weighting factors for connecting data items $a_1$ to $a_7$ and data item $b_2$ and connection weighting factors for connecting data items $a_1$ to $a_7$ and data item $b_6$ are stored. In memory cells 51 that are connected to the intersections between the word lines and one or more bit lines that are connected to determination circuit 153, connection weighting factors for connecting data items $a_1$ to $a_7$ and data item $b_3$ and connection weighting factors for connecting data items $a_1$ to $a_7$ and data item $b_7$ are stored. In memory cells 51 that are connected to the intersections between the word lines and one or more bit lines that are connected to determination circuit 154, connection weighting factors for connecting data items $a_1$ to $a_7$ and data item $b_4$ are stored.

Four word lines WL [3] [1] to WL [3] [4] in a selected state correspond to $b_1$ to $b_4$ of $b_1$ to $b_7$ that are output data items of seven neurons included in hidden layer 73, or in other words, input data items of two neurons included in output layer 74. Three word lines WL [4] [1] to WL [4] [3] in a selected state correspond to $b_5$ to $b_7$ respectively. In memory cells 51 that are connected to the intersections between seven word lines WL [4] [3:1] to WL [3] [4:1] and one or more bit lines that are connected to determination circuits 151 to 152 by column selection circuit 14, weighting factors of connection weights 71 that connect eight neurons 70 of hidden layer 73 and two neurons 70 of output layer 74 are stored.

Here, in memory cells 51 that are connected to the intersections between the word lines and one or more bit lines that are connected to determination circuit 151, connection weighting factors for connecting data items $b_1$ to $b_7$ and data item $z_1$ are stored. In memory cells 51 that are connected to the intersections between the word lines and one or more bit lines that are connected to determination circuit 152, connection weighting factors for connecting data items $b_1$ to $b_7$ and data item $z_2$ are stored.

In memory cells 51 that are connected to the intersections between the word lines and one or more bit lines that are connected to determination circuits 153 and 154 at this time, no connection weighting factors are stored.

Figure 17:
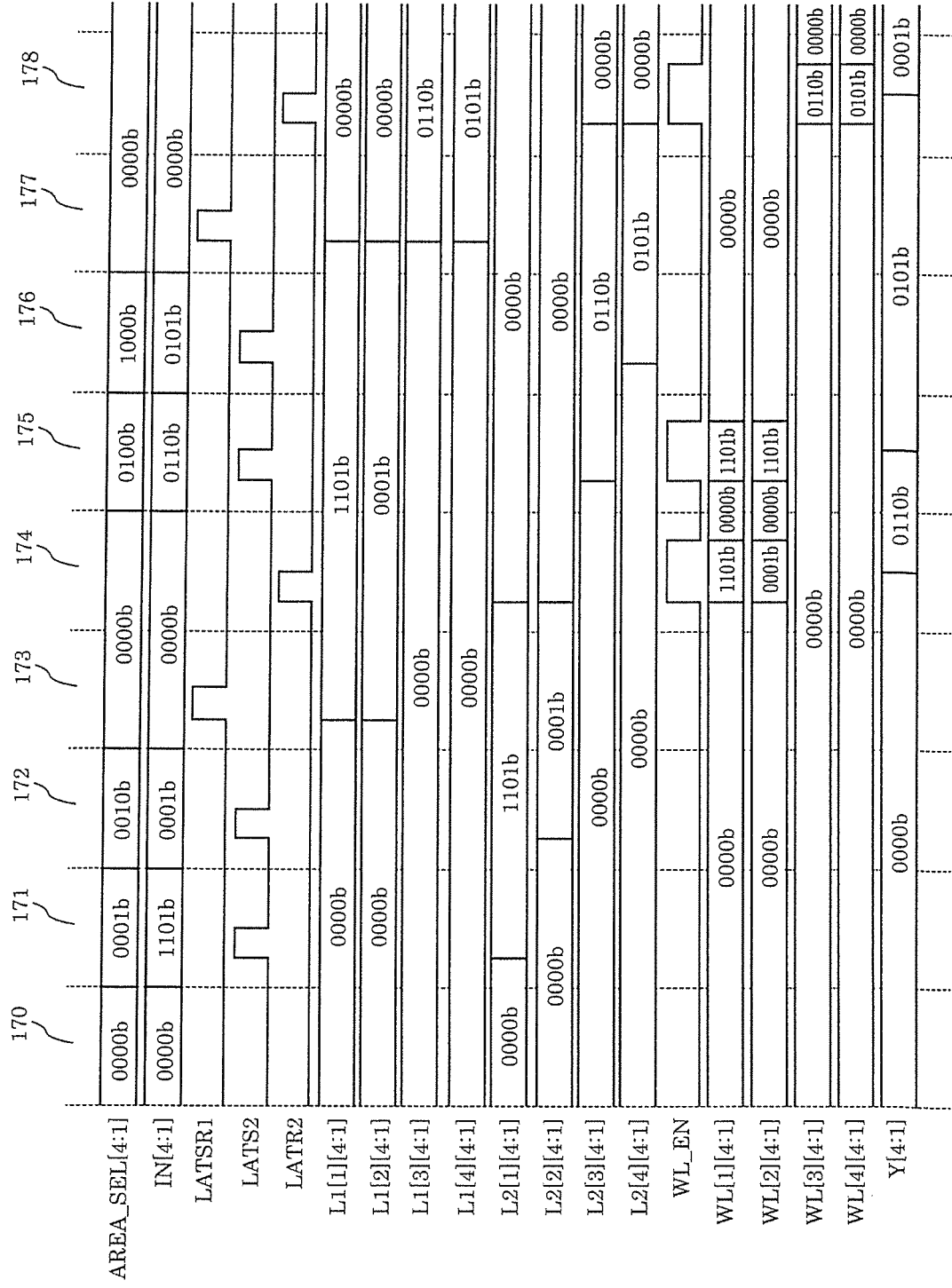
FIG. 17 is a diagram showing another example of operations of the neural network computation circuit including semiconductor storage elements according to Embodiment 1.

FIG. 17 is a diagram showing operations of the neural network computation circuit according to the present embodiment used as the neural network shown in FIG. 15. FIG. 17 corresponds to the data shown in FIG. 16. The names of signals shown in FIG. 17 are the same as those of the signals shown in FIG. 14.

The computation operations of the neural network shown in FIG. 15 are performed using nine operation steps 170 to 178.

Operation step 170 is the initial state. In operation steps 171 to 176, the computation operations of seven neurons 70 included in hidden layer 73 are performed. In operation steps 177 and 178, the computation operations of two neurons 70 included in output layer 74 are performed.

Hereinafter, each of the operation steps will be described in detail.

In operation step 171, AREA_SEL [4:1] is set to "0001b", IN [4:1] is set to "1101b" that is data that corresponds to $a_1$ to $a_4$ among seven input data items $a_1$ to $a_7$, and LATS2 is transitioned from "L" level to "H" level and from "H" level to "L" level. As a result, L2 [1] [4:1] that is the output signal of second latches 32 included in in-area multiple-word line selection circuit [1] that is one of in-area multiple-word line selection circuits 21 that corresponds to WL [1] [4:1] is set to "1101b".

Next, in operation step 172, AREA_SEL [4:1] is set to "0010b", IN [4:1] is set to "001b" that is data that corresponds to $a_7$ to $a_5$ among seven input data items $a_1$ to $a_7$, IN[4] for which there is no corresponding input data is fixed to "0b", and LATS2 is transitioned from "L" level to "H" level and from "H" level to "L" level. As a result, output signal L2 [2] [4:1] that is the output signal of second latches 32 included in in-area multiple-word line selection circuit [2] that is one of in-area multiple-word line selection circuits 21 that corresponds to WL [2] [4:1] is set to "0001b".

After this operation step, signals that correspond to seven input data items $a_1$ to $a_7$ are set in L2 [1] [4:1] and L2 [2] [3:1] as output signals of second latches 32.

Next, in operation step 173, when LATSR1 is transitioned from "L" level to "H" level and from "H" level to "L" level, output signals L2 [4:1] [4:1] of the second latches in in-area multiple-word line selection circuit 21 are transferred to and set in output signals L1 [4:1] [4:1] of the respectively connected first latches, and L1 [1] [4:1] is set to "1101b", and L1 [2] [4:1] is set to "0001b".

Next, in operation step 174, when WL_EN is transitioned from "L" level to "H" level, word lines that correspond to input data items $a_1$ to $a_4$, $a_5$ to $a_7$ are selected for word lines WL [1] [4:1] and WL [2] [3:1], respectively.

In the multiple-word line selected state, column selection circuit 14 connects one or more of the plurality of bit lines of memory array 10 connected to memory cells 51, in which connection weighting factors of connection weights 71 between neurons 70 of input layer 72 and neurons 70 of hidden layer 73 having output data items $b_1$ to $b_4$ are stored, to determination circuits 151 to 154.

Determination circuits 151 to 154 each output one output data item to Y [4:1] as a result of multiplication-accumulation computation operation of neurons, based on the voltage state of the connected bit lines or the electric current state of electric current that flows through the bit lines.

Here, among output data items $b_1$ to $b_7$ of seven neurons 70 of hidden layer 73, Y [4:1] as four output data items that correspond to $b_1$ to $b_4$ is output with "0110b" being set.

At the same time, IN [4:1] is set to "0000b", and LATR2 is transitioned from "L" level to "H" level and from "H" level to "L" level, as a result of which all of output signals L2 [4:1] [4:1] of second latches 32 are set to "0".

Through this operation step, among seven output data items $b_1$ to $b_7$ that are the results of multiplication-accumulation computation operation of seven neurons of hidden layer 73, four output data items $b_1$ to $b_4$ are determined.

On the other hand, in order to perform multiplication-accumulation computation operation of two neurons 70 included in output layer 74, it is necessary to use seven data items $b_1$ to $b_7$ as input data. In operation step 175, which will be described below, three output data items $b_5$ to $b_7$ are determined.

In operation step 175, WL_EN is transitioned from "L" level to "H" level, as a result of which word lines that correspond to input data items $a_1$ to $a_4$ and $a_5$ to $a_7$ are selected for word lines WL [1] [4:1] and WL [2] [3:1], respectively.

In the multiple-word line selected state, column selection circuit 14 connects one or more of the plurality of bit lines of memory array 10 connected to memory cells 51, in which connection weighting factors of connection weights 71 between neurons 70 of input layer 72 and neurons 70 of hidden layer 73 having output data items $b_5$ to $b_7$ are stored, to determination circuits 151 to 153.

No connection weighting factors are stored in memory cells 51 that are connected to the bit lines simultaneously connected to determination circuit 154.

Determination circuits 151 to 153 each output one output data item to Y [3:1] as a result of multiplication-accumulation computation operation of neurons, based on the voltage state of the connected bit lines or the electric current state of electric current that flows through the bit lines.

Here, among output data items $b_1$ to $b_7$ of seven neurons 70 of hidden layer 73, Y [3:1] as three output data items that correspond to $b_5$ to $b_7$ is output with "101b" being set.

Here, because no connection weighting factors are stored in memory cells 51 that are connected to the bit lines connected to determination circuit 154, termination circuit 154, although output data Y [4] is invalid output data, here, "0b" is output, and Y [4:1] is output with "0101b" being set.

At this time, AREA_SEL [4:1] is set to "0100b", "0110b" that is data that corresponds to output data items $b_1$ to $b_4$ obtained in operation step 174 is set as IN [4:1], and LATS2 is transitioned from "L" level to "H" level and from "H" level to "L" level. As a result, output signal L2 [3] [4:1] that is the output signal of second latches 32 included in in-area multiple-word line selection circuit [3] that is one of in-area multiple-word line selection circuits 21 that corresponds to WL [3] [4:1] is set to "0110b".

Next, in operation step 146, AREA_SEL [4:1] is set to "1000b", and "101b" that corresponds to output data $b_5$ to $b_7$ obtained in operation step 145 is set as IN [3:1].

At this time, irrespective of the value of Y [4], IN[4] is fixed to "0b", IN [4:1] is set to "0101b", and LATS2 is transitioned from "L" level to "H" level and from "H" level to "L" level. As a result, output signal L2 [4] [4:1] that is the output signal of second latches 32 included in in-area multiple-word line selection circuit [4] that is one of in-area multiple-word line selection circuits 21 that corresponds to WL [4] [4:1] is set to "0101b".

After this operation step, output data $b_1$ to $b_7$ of hidden layer 73 are determined, and L2 [3] [4:1] and L2 [4] [3:1] are set as the output signals of second latch 32.

Next, in operation step 177, LATSR1 is transitioned from "L" level to "H" level and from "H" level to "L" level. As a result, output signals L2 [4:1] [4:1] of second latches 32 in in-area multiple-word line selection circuit 21 are transferred and set as output signals L1 [4:1] [4:1] of the connected first latches, and L1 [1] [4:1] is set to "0110b", and L1 [2] [3:1] is set to "101b".

Next, in operation step 178, word line selection signal WL_EN is transitioned from "L" level to "H" level. As a result, word lines that correspond to $b_1$ to $b_4$ and $b_5$ to $b_7$ are selected for word lines WL [3] [4:1] and WL [4] [3:1], respectively.

In the multiple-word line selected state, column selection circuit 14 connects one or more of the plurality of bit lines of memory array 10 connected to memory cells 51, in which connection weighting factors of connection weights 71 between neurons 70 of hidden layer 73 and neurons 70 of output layer 74 are stored, to determination circuits 151 and 152.

Each of determination circuits 151 and 152 outputs one output data item to Y [2:1] based on the voltage state of the connected bit lines or the electric current state of electric current that flows through the bit lines.

No connection weighting factors are stored in memory cells 51 that are connected to the bit lines simultaneously connected to determination circuits 153 and 154, and thus although output data Y [4:3] is invalid output data, here, "00b" is output, and Y [4:1] is output with "0001b" being set.

Output data items $z_1$ and $z_2$ that are valid among four output data items are each Y [2:1], and control circuit 16 performs control to ignore Y [4:3] that is invalid output data.

Through operation steps 170 to 178 described above, as shown in FIG. 15, the computation operations of the neural network are possible even when the number of inputs of input layer 72 and the number of neurons of hidden layer 73 are not are not integral multiples of n (here, n is 4).

Although the embodiment of the present disclosure has been described above, the neural network computation circuit including semiconductor storage elements according to an aspect of the present disclosure is not limited to the embodiment given above, and the present disclosure also encompasses embodiments obtained by making various modifications within the range that does not depart from the gist of the present disclosure.

For example, for the sake of simplification of the description, the embodiment and the operations have been described specifically by setting n that is the number of determination circuits to 4, and m that is the number of word line areas to 4, but n and m may be any number.

Also, the above example has been described assuming that hidden layer 73 includes neurons arranged in one column, but the same operations are possible even when hidden layer 73 includes neurons arranged in a plurality of columns.

Embodiment 2

Figure 18:
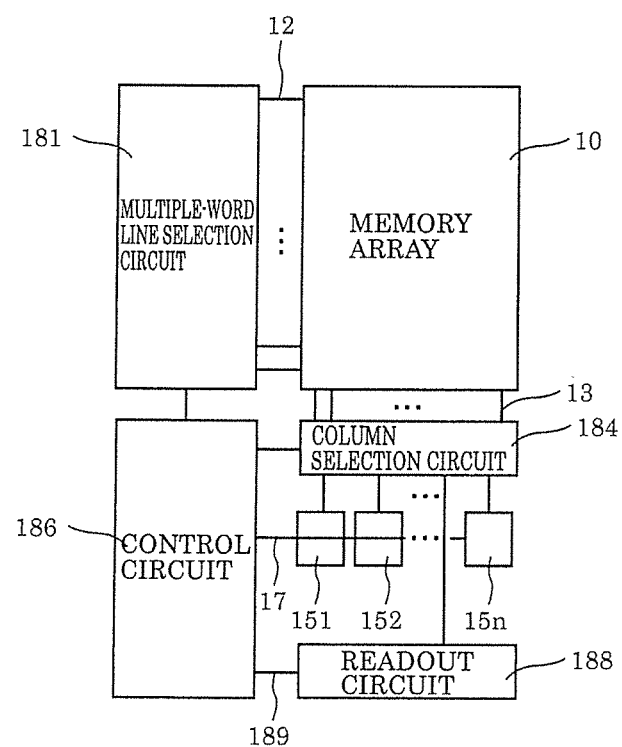
FIG. 18 is a diagram showing a configuration of a neural network computation circuit including semiconductor storage elements according to Embodiment 2.

FIG. 18 is a diagram showing a configuration of a neural network computation circuit including semiconductor storage elements according to Embodiment 2.

The neural network computation circuit including semiconductor storage elements according to Embodiment 2 has a configuration in which a mode switching operation of switching between the following two modes can be performed: a neural network computation operation mode in which neural network computation operations are performed; and a memory operation mode in which memory data stored in memory cells is read out.

Multiple-word line selection circuit 181 performs an operation of setting one or more word lines of a plurality of word lines 12 in a selected state or a non-selected state during the neural network computation operation mode, and performs an operation of setting one of the plurality of word lines 12 in a selected state or a non-selected state during the memory operation mode.

Column selection circuit 184 performs an operation of selecting n determination circuits 151 to 15$n$ (where n is an integer of 1 or more) and one or more of a plurality of bit lines 13 and connecting the one or more of plurality of bit lines 13 to n determination circuits 151 to 15$n$ during the neural network computation operation mode, and performs an operation of selecting one or more of the plurality of bit lines 13 and connecting the one or more of the plurality of bit lines 13 to readout circuit 188 during the memory operation mode.

Control circuit 186 controls multiple-word line selection circuit 181, column selection circuit 184, and determination circuits 151 to 15$n$.

Readout circuit 188 is a memory readout circuit that outputs, to memory data 189, data state of memory cells that are connected to the intersections between the word lines selected by multiple-word line selection circuit 181 during the memory operation mode and the bit lines connected by column selection circuit 184.

Other structural elements such as memory array 10 and determination circuits 151 to 15$n$ are the same as those of Embodiment 1 shown in FIG. 1.

Figure 19:
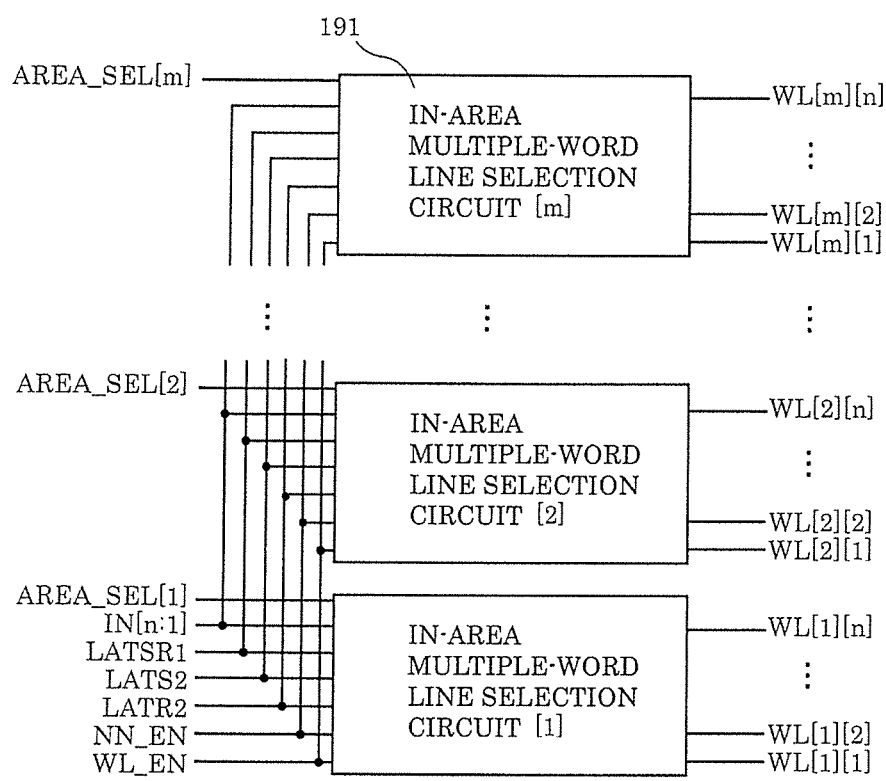
FIG. 19 is a diagram showing a configuration of multiple-word line selection circuit 181 shown in FIG. 18.

FIG. 19 is a diagram showing a configuration of multiple-word line selection circuit 181 shown in FIG. 18. Multiple-word line selection circuit 181 has a configuration obtained by modifying multiple-word line selection circuit 11 shown in FIG. 2 such that neural network operation mode signal (mode switching signal) NN_EN is additionally input, and multiple-word line selection circuit 181 includes a plurality of in-area multiple-word line selection circuits 191 that respectively correspond to m word lines areas.

Figure 20:
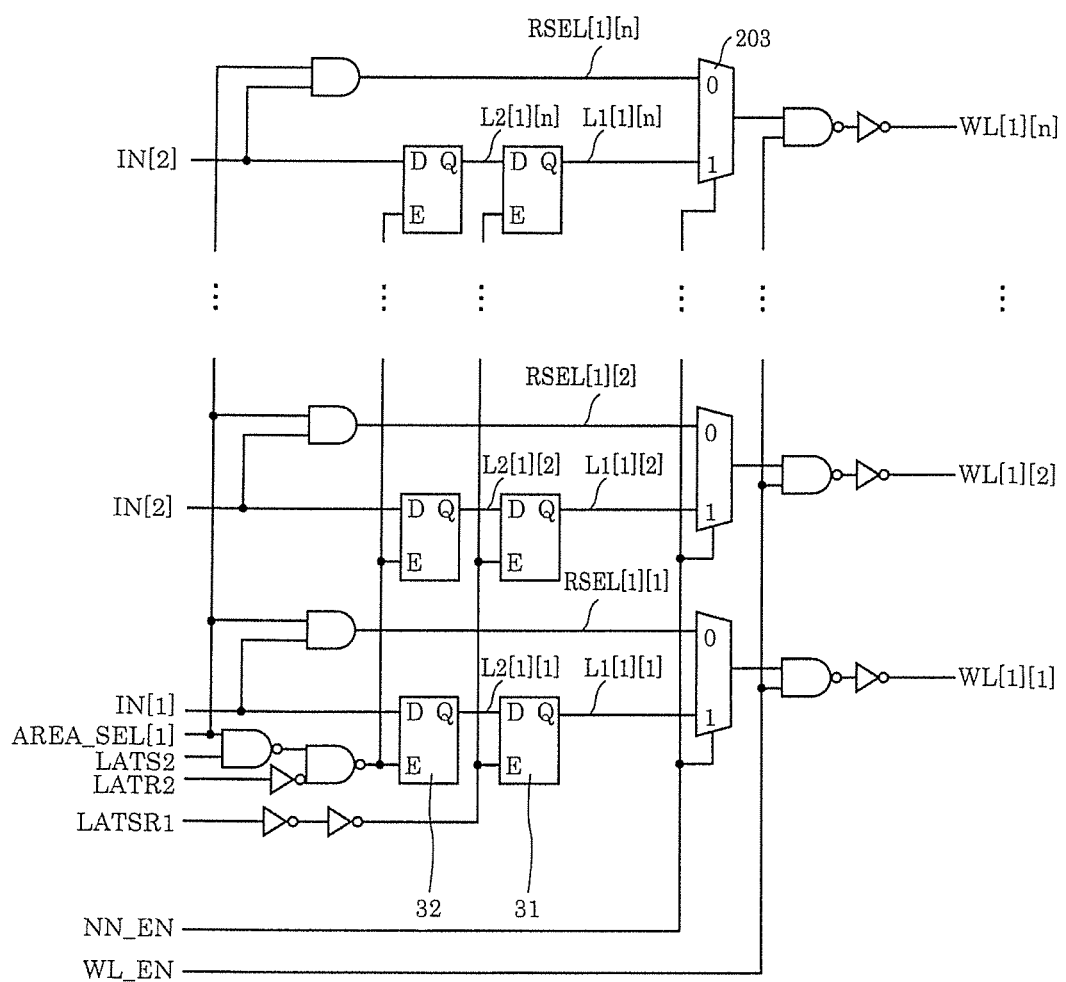
FIG. 20 is a diagram showing a configuration of in-area multiple-word line selection circuit 191 shown in FIG. 19.

FIG. 20 is a diagram showing a configuration of in-area multiple-word line selection circuit 191 shown in FIG. 19, and specifically shows a configuration of in-area multiple-word line selection circuit [1] that is one of m in-area multiple-word line selection circuits 191 that corresponds to WL [1] [n:1]. As with the in-area multiple-word line selection circuit of Embodiment 1 shown in FIG. 3, first latch 31 and second latch are provided for each of the word lines in the word line area. However, in the circuit shown in FIG. 20, switching circuit 203 is connected to the output signal of each of first latches 31.

Switching circuit 203 includes two inputs of "0" and "1". RSEL [1] [n:1] that is AND output of area selection signal AREA_SEL [1] and in-area word line control signals IN [n:1] is connected to the "0" side, and L1 [1] [n:1] that is the output of first latch 31 is connected to "1" side. When neural network operation mode signal NN_EN is set to "H", the neural network computation operation mode is set, L1 [1] [n:1] that is connected to "1" side is output. When neural network operation mode signal NN_EN is set to "L", the memory operation mode is set, RSEL [1] [n:1] is output.

In the neural network computation operation mode, control circuit 186 sets NN_EN to "H" state. At this time, the same operations as those described in Embodiment 1 are performed to perform computation operations of the neural network.

In the memory operation mode, control circuit 186 sets NN_EN "L" state. For each of area selection signal AREA_SEL [m:1] and in-area word line control signals IN [n:1], signals that correspond to word lines to be read out are set to "H" state, and the word line selection signal is set to "H". In-area multiple-word line selection circuit 191 that corresponds to the word lines to be read out selects one word line. Readout circuit 188 performs a readout/determining operation of outputting a first logical value or a second logical value as memory data based on the voltage state of the bit lines connected by column selection circuit or the current state of electric current that flows through the bit lines. As a result, the data state of target memory cells can be obtained as memory data 189.

With the neural network computation circuit including semiconductor storage elements according to Embodiment 2 described above, the function of performing a memory cell readout operation can be added in addition to the neural network computation operations implemented by Embodiment 1.

The embodiments of the present disclosure have been described above, but the neural network computation circuit including semiconductor storage elements according to the present disclosure is not limited to the embodiments given above, and the present disclosure also encompasses embodiments obtained by making various modifications within the range that does not depart from the gist of the present disclosure.

For example, in the neural network computation circuits including semiconductor storage elements according to the embodiments described above, resistance variable non-volatile memories (ReRAM) are used. However, the present disclosure is also applicable to non-volatile semiconductor storage elements other than resistance variable memories such as magneto-resistive non-volatile memories (MRAM), phase-change non-volatile memories (PRAM), and ferroelectric non-volatile memories (FeRAM).

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The neural network computation circuit including semiconductor storage elements according to the present disclosure can implement large-scale neural network computation without an area increase caused by preparing a plurality of sets of peripheral circuits such as conventional determination circuits.

Accordingly, the present disclosure has the effect of being capable of implementing large-scale integration of the neural network computation circuit using a small area, and is useful for, for example, a semiconductor integrated circuit that incorporates AI (Artificial Intelligence) technology with which it can learn and make decisions by itself, and an electronic device that incorporates the semiconductor integrated circuit.

What is claimed is:
1. A neural network computation circuit including semiconductor storage elements, the neural network computation circuit comprising:
    a memory array that includes a plurality of memory cells arranged in rows and columns, each of the plurality of memory cells being connected to one of a plurality of word lines and one of a plurality of bit lines;
    a multiple-word line selection circuit that sets one or more word lines of the plurality of word lines in a selected state or a non-selected state;
    n determination circuits that perform computation operations of neurons of a neural network, n being an integer of 1 or more;
    a column selection circuit that connects one or more of the plurality of bit lines to each of the n determination circuits; and
    a control circuit that controls the multiple-word line selection circuit,
    wherein the plurality of word lines are logically divided into a plurality of word line areas, each of the plurality of word line areas including n word lines,
    the multiple-word line selection circuit includes a plurality of in-area multiple-word line selection circuits that are provided in one-to-one correspondence to the plurality of word line areas, each of the plurality of in-area multiple-word line selection circuits setting the n word lines included in a corresponding one of the plurality of word line areas in a selected state or a non-selected state,
    each of the plurality of in-area multiple-word line selection circuits includes a first latch and a second latch provided for each of the n word lines, determines a set state of the first latch and a set state of the second latch based on an area selection signal, an in-area word line control signal, a first latch control signal, a second latch control signal, and a word line selection signal that are controlled by the control circuit, and sets a correspond- ing one of the n word lines in a selected state or a non-selected state based on the set state of the first latch, and in a multiple-word line selected state selected by the multiple-word line selection circuit, the n determination circuits each perform a determining operation of outputting a first logical value or a second logical value as output data of the computation operations of the neurons of the neural network based on a voltage state of the one or more of the plurality of bit lines connected by the column selection circuit or a current state of electric current flowing through the one or more of the plurality of bit lines.

2. The neural network computation circuit according to claim 1, wherein the control circuit performs the determining operation a plurality of times in the multiple-word line selected state, the control circuit sequentially performs an operation of determining, based on n results obtained in a single instance of the determining operation, set states of n second latches provided in one of the plurality of in-area multiple-word line selection circuits selected based on the area selection signal, while switching the area selection signal, the n second latches being the second latch provided for each of the n word lines, and after performing the determining operation the plurality of times, the control circuit transfers and sets the set states of the n second latches to and in first latches connected to the n second latches, the first latches being the first latch provided for each of the n word lines.

3. The neural network computation circuit according to claim 1, wherein the multiple-word line selected state corresponds to input data of the neurons of the neural network.

4. The neural network computation circuit according to claim 1, wherein each of the plurality of memory cells stores connection weighting factors of the neural network.

5. The neural network computation circuit according to claim 1, wherein each of the plurality of memory cells is a resistance variable non-volatile memory element that is formed using a resistance variable element, and stores connection weighting factors of the neural network as resistance values.

6. A neural network computation circuit including semiconductor storage elements, the neural network computation circuit comprising:

a memory array that includes a plurality of memory cells arranged in rows and columns, each of the plurality of memory cells being connected to one of a plurality of word lines and one of a plurality of bit lines;

a multiple-word line selection circuit that sets one or more word lines of the plurality of word lines in a selected state or a non-selected state;

n determination circuits that perform computation operations of neurons of a neural network, n being an integer of 1 or more;

one or more readout circuits that determine logic states of the plurality of memory cells;

a column selection circuit that connects one or more of the plurality of bit lines to each of the n determination circuits or to the one or more readout circuits; and a control circuit that controls the multiple-word line selection circuit, wherein the plurality of word lines are logically divided into a plurality of word line areas, each of the plurality of word line areas including n word lines, the multiple-word line selection circuit includes a plurality of in-area multiple-word line selection circuits that are provided in one-to-one correspondence to the plurality of word line areas, each of the plurality of in-area multiple-word line selection circuits being capable of performing two operations: an operation in a neural network computation operation mode of setting the n word lines included in a corresponding one of the plurality of word line areas in a selected state or a non-selected state; and an operation in a memory operation mode of setting one word line included in the corresponding one of the plurality of word line areas in a selected state or a non-selected state by switching between the two operations, each of the plurality of in-area multiple-word line selection circuits includes a first latch, a second latch, and a switching circuit that is connected to an output of the first latch provided for each of the n word lines, with an area selection signal, an in-area word line control signal, a first latch control signal, a second latch control signal, a word line selection signal, and a mode switching signal that are controlled by the control circuit, when the mode switching signal is in a signal state that corresponds to the neural network computation operation mode, each of the plurality of in-area multiple-word line selection circuits determines a set state of the first latch and a set state of the second latch and sets the corresponding word line based on the set state of the first latch via the switching circuit in a selected state or a non-selected state, as the neural network computation operation mode, and when the mode switching signal is in a signal state that corresponds to the memory operation mode, each of the plurality of in-area multiple-word line selection circuits sets the corresponding word line based on the area selection signal, the in-area word line control signal, and the word line selection signal via the switching circuit in a selected state or a non-selected state, as the memory operation mode, during the neural network computation operation mode, in a multiple-word line selected state selected by the multiple-word line selection circuit, the n determination circuits each perform a determining operation of outputting a first logical value or a second logical value as output data of the computation operations of the neurons of the neural network based on a voltage state of the one or more of the plurality of bit lines connected by the column selection circuit or a current state of electric current flowing through the one or more of the plurality of bit lines, in the memory operation mode, in a state in which one word line is selected by the multiple-word line selection circuit, the one or more readout circuits performs a readout/determining operation of outputting a first logical value or a second logical value as memory data based on a voltage state of the one or more of the plurality of bit lines connected by the column selection circuit or a current state of electric current flowing through the one or more of the plurality of bit lines.

7. The neural network computation circuit according to claim 6, wherein the control circuit performs the determining operation a plurality of times in the multiple-word line selected state, the control circuit sequentially performs an operation of determining, based on n results obtained in a single instance of the determining operation, set states of n second latches provided in one of the plurality of in-area multiple-word line selection circuits selected based on the area selection signal, while switching the area selection signal, the n second latches being the second latch provided for each of the n word lines, and after performing the determining operation the plurality of times, the control circuit transfers and sets the set states of the n second latches to and in first latches connected to the n second latches, the first latches being the first latch provided for each of the n word lines.

8. The neural network computation circuit according to claim 6, wherein the multiple-word line selected state during the neural network computation operation mode corresponds to input data of the neurons of the neural network.

9. The neural network computation circuit according to claim 6, wherein each of the plurality of memory cells stores connection weighting factors of the neural network or memory data.

10. The neural network computation circuit according to claim 6, wherein each of the plurality of memory cells is a resistance variable non-volatile memory element that is formed using a resistance variable element, and stores connection weighting factors of the neural network as resistance values or stores memory data.

* * * * *